United States Patent
Wu et al.

(10) Patent No.: US 12,142,704 B2
(45) Date of Patent: Nov. 12, 2024

(54) TANDEM PHOTOVOLTAIC DEVICE AND PRODUCTION METHOD

(71) Applicant: LONGI GREEN ENERGY TECHNOLOGY CO., LTD., Shaanxi (CN)

(72) Inventors: Zhao Wu, Shaanxi (CN); Chen Xu, Shaanxi (CN); Zifeng Li, Shaanxi (CN)

(73) Assignee: LONGI GREEN ENERGY TECHNOLOGY CO., LTD., Shaanxi (CN)

( * ) Notice: Subject to any disclaimer, the term of this patent is extended or adjusted under 35 U.S.C. 154(b) by 22 days.

(21) Appl. No.: 17/912,869

(22) PCT Filed: Nov. 3, 2020

(86) PCT No.: PCT/CN2020/126078
§ 371 (c)(1),
(2) Date: Sep. 20, 2022

(87) PCT Pub. No.: WO2021/189860
PCT Pub. Date: Sep. 30, 2021

(65) Prior Publication Data
US 2023/0144354 A1    May 11, 2023

(30) Foreign Application Priority Data
Mar. 27, 2020    (CN) .......................... 202010231541.0

(51) Int. Cl.
*H01L 31/0687*    (2012.01)
*H01L 31/0236*    (2006.01)
*H01L 31/18*    (2006.01)

(52) U.S. Cl.
CPC .... *H01L 31/0687* (2013.01); *H01L 31/02363* (2013.01); *H01L 31/1804* (2013.01)

(58) Field of Classification Search
None
See application file for complete search history.

(56) References Cited

U.S. PATENT DOCUMENTS

| | | | | |
|---|---|---|---|---|
| 4,377,723 A | * | 3/1983 | Dalal | H01L 31/076 |
| | | | | 136/258 |
| 2009/0272423 A1 | * | 11/2009 | Niira | H01L 31/1055 |
| | | | | 136/244 |

(Continued)

FOREIGN PATENT DOCUMENTS

| | | |
|---|---|---|
| CN | 101246926 | 8/2008 |
| CN | 102244134 | 11/2011 |

(Continued)

OTHER PUBLICATIONS

Machine translation of CN209912878U (Year: 2020).*

(Continued)

*Primary Examiner* — Ryan S Cannon
(74) *Attorney, Agent, or Firm* — NIXON PEABODY LLP; Jeffrey L. Costellia

(57) ABSTRACT

A tandem photovoltaic device and production method. The tandem photovoltaic device includes: an upper battery cell and a lower battery cell, and a tunnel junction located between the upper battery cell and the battery cell; the lower battery is a crystalline silicon cell; the tunnel junction includes: an upper crystalline silicon layer, a lower crystalline silicon layer and an intermediate layer located between the upper crystalline silicon layer and the lower crystalline silicon layer; the upper crystalline silicon layer, the lower crystalline silicon layer and the intermediate layer are in direct contact, and the doping types of the upper crystalline silicon layer and the lower crystalline silicon layer are opposite; the doping concentration of the upper crystalline silicon layer at the interface with the intermediate layer and (Continued)

the doping concentration of the lower crystalline silicon layer at the interface with the intermediate layer are greater than or equal to $10^{18}$ cm$^{-3}$.

10 Claims, 3 Drawing Sheets

(56) References Cited

U.S. PATENT DOCUMENTS

| | | | |
|---|---|---|---|
| 2011/0162697 A1* | 7/2011 | Sivananthan | H01L 31/028 438/57 |
| 2012/0080081 A1* | 4/2012 | Klein | C23C 16/401 136/255 |
| 2012/0138132 A1 | 6/2012 | Guha et al. | |
| 2014/0290727 A1 | 10/2014 | Yamamoto | |
| 2017/0077339 A1 | 3/2017 | Ma et al. | |
| 2020/0058819 A1 | 2/2020 | Kirner | |

FOREIGN PATENT DOCUMENTS

| | | | |
|---|---|---|---|
| CN | 103022271 | | 4/2013 |
| CN | 105900248 | | 8/2016 |
| CN | 209912878 U | * | 1/2020 |
| WO | WO-2018/150203 | | 8/2018 |
| WO | WO-2019/050185 | | 3/2019 |

OTHER PUBLICATIONS

Australian Office Action (Application No. 2020437211) mailed Aug. 24, 2023, (3 pages).
Chinese Office Action for Application No. 2022091302183270, mailed Sep. 16, 2022, (8 pages).
International Search Report for Application No. PCT/CN2020/126078, mailed Feb. 1, 2021 (4 pages).
Extended European Search Report for App. No. 20927947.0, dated Feb. 12, 2024 (5 pages).

* cited by examiner

TANDEM PHOTOVOLTAIC DEVICE AND PRODUCTION METHOD

CROSS-REFERENCE TO RELATED APPLICATIONS

The present application claims the priority of the Chinese patent application filed on Mar. 27, 2020 before the CNIPA, China National Intellectual Property Administration with the application number of 202010231541.0 and the title of "TANDEM PHOTOVOLTAIC DEVICE AND PRODUCTION METHOD", which is incorporated herein in its entirety by reference.

TECHNICAL FIELD

The present disclosure relates to the technical field of photovoltaics, and more particularly, to a tandem photovoltaic device and a manufacturing method thereof.

BACKGROUND

A tandem photovoltaic device is capable of dividing the sunlight into a plurality of wave bands, and the sunlight with different energies may be absorbed by using solar cell units with gradually decreasing band gaps from front to back, so as to broaden a spectral response band to sunlight and reduce energy loss. Therefore, the application prospect of the tandem photovoltaic device is broad. The tandem photovoltaic device with crystalline silicon cells as lower cell units are provided with a large production space.

A tunnel junction is provided with a strong transmission and recombination capability and its thickness required to achieve a higher recombination rate is relatively thin. Therefore, the tunnel junction is usually used to connect each cell unit in series in the tandem photovoltaic devices.

However, in the related art, the tunneling efficiency of tunnel junction of the tandem photovoltaic device with the crystalline silicon cells as the lower cell units is low, and the overall series resistance of the device is relatively high.

SUMMARY

A tandem photovoltaic device and a manufacturing method thereof are provided in the present disclosure, aiming at solving problems of low tunneling efficiency of a tunnel junction and high overall series resistance of a tandem photovoltaic device with a crystalline silicon cell as a lower cell unit.

According to a first aspect of the present disclosure, a tandem photovoltaic device is provided, which includes an upper cell unit and a lower cell unit, and a tunnel junction between the upper cell unit and the lower cell unit. The lower cell unit is a crystalline silicon cell.

The tunnel junction includes an upper crystalline silicon layer, a lower crystalline silicon layer and an intermediate layer between the upper crystalline silicon layer and the lower crystalline silicon layer.

The upper crystalline silicon layer, the lower crystalline silicon layer and the intermediate layer are in direct contact with each other, and doping types of the upper crystalline silicon layer and the lower crystalline silicon layer are opposite. A doping concentration of the upper crystalline silicon layer at an interface with the intermediate layer, and a doping concentration of the lower crystalline silicon layer at an interface with the intermediate layer are both greater than or equal to $10^{18}$ $cm^{-3}$.

The intermediate layer includes at least one dielectric layer, and band gap width of the dielectric layer is greater than or equal to 3 eV.

Optionally, dielectric strength of the dielectric layer is greater than or equal to 3 MV/cm.

Optional, the dielectric layer is made of a material selected from at least one of: silicon oxide, silicon nitride, silicon oxynitride, silicon halide, silicon oxyfluoride, silicon oxycarbide, alkali metal oxide, alkali metal nitride, alkali metal oxynitride, alkali metal halide, alkali metal oxyfluoride, transition metal oxide, transition metal nitride, transition metal oxynitride, transition metal halide, transition metal oxyfluoride, Group III metal oxide, Group III metal nitride, Group III metal oxynitride, Group III metal Metal halides, Group III metal oxyfluorides, Group IV metal nitrides, Group IV metal oxynitrides, Group IV metal halides, or Group IV metal oxyfluorides.

Optionally, the dielectric layer is made of a material selected from at least one of: silicon oxide, silicon nitride, silicon fluoride, silicon oxyfluoride, silicon oxycarbide, aluminum oxide, aluminum fluoride or aluminum oxynitride.

Optionally, thicknesses of the upper crystalline silicon layer and the lower crystalline silicon layer are both 2 to 100 nm.

A thickness of the intermediate layer is 0.1 to 5 nm.

Optionally, the intermediate layer further includes a first transition layer between the dielectric layer and the upper crystalline silicon layer and in direct contact with the upper crystalline silicon layer, and/or a second transition layer between the dielectric layer and the lower crystalline silicon layer and in direct contact with the lower crystalline silicon layer.

The first transition layer is made of a material selected from at least one product of an interfacial reaction between the dielectric layer and the upper crystalline silicon layer.

The second transition layer is made of a material selected from at least one product of an interfacial reaction between the dielectric layer and the lower crystalline silicon layer.

Optionally, in a tandem direction of the tandem photovoltaic device, the upper crystalline silicon layer is provided with a doping concentration gradient, and/or the lower crystalline silicon layer is provided with a doping concentration gradient.

Optionally, a light-facing surface of the lower cell unit is provided with a light-trapping structure, and a backlight surface of the tunnel junction is adapted to a shape of the light-facing surface of the lower cell unit.

According to a second aspect of the present disclosure, there is provided a manufacturing method for a tandem photovoltaic device, which includes following steps.

A lower cell unit is prepared, the lower cell unit is a crystalline silicon cell.

A tunnel junction is prepared. The tunnel junction includes an upper crystalline silicon layer, a lower crystalline silicon layer and an intermediate layer between the upper crystalline silicon layer and the lower crystalline silicon layer. The upper crystalline silicon layer, the lower crystalline silicon layer and the intermediate layer are in direct contact with each other, and doping types of the upper crystalline silicon layer and the lower crystalline silicon layer are opposite. A doping concentration of the upper crystalline silicon layer at an interface with the intermediate layer and a doping concentration of the lower crystalline silicon layer at an interface with the intermediate layer are both greater than or equal to $10^{18}$ $cm^{-3}$. The intermediate layer includes at least one dielectric layer. A band gap width of the dielectric layer is greater than or equal to 3 eV.

An upper cell unit is prepared.

Optionally, the lower crystalline silicon layer can be prepared with one of following processes:

deposition, doping and growing.

The intermediate layer is prepared with one of following processes:

deposition, water bath, coating, surface in-situ chemical synthesis, wet thermal oxidation, dry thermal oxidation, plasma oxidation, and plasma enhanced or assisted oxidation.

The upper crystalline silicon layer is prepared with one of following processes:

deposition and growing.

Optionally, the intermediate layer further includes a first transition layer between the dielectric layer and the upper crystalline silicon layer and in direct contact with the upper crystalline silicon layer, and/or a second transition layer between the dielectric layer and the lower crystalline silicon layer and in direct contact with the lower crystalline silicon layer. A step in which the tunnel junction is prepared includes following content.

A first transition layer is formed between the dielectric layer and the upper crystalline silicon layer. The first transition layer is made of a material selected from at least one product of an interfacial reaction between the dielectric layer and the upper crystalline silicon layer.

The second transition layer is formed between the dielectric layer and the lower crystalline silicon layer. The second transition layer is made of a material selected from at least one product of an interfacial reaction between the dielectric layer and the lower crystalline silicon layer.

According to the embodiments of the disclosure, in view of the tandem photovoltaic device with the lower cell unit being the crystalline silicon cell, by introducing the intermediate layer including the dielectric layer between the upper crystalline silicon layer and the lower crystalline silicon layer, mutual diffusion of doping elements in the upper crystalline silicon layer and the lower crystalline silicon layer with opposite doping types can be effectively alleviated under barrier effect of the dielectric layer, so that an abrupt doping interface structure is formed at their interfaces, and effective doping concentration on both sides can be improved, thereby effectively improving the tunneling efficiency, reducing the series resistance of the tunnel junction and improving a peak tunneling current. Meanwhile, the doping concentration of the upper crystalline silicon layer at the interface with the intermediate layer and the doping concentration of the lower crystalline silicon layer at the interface with the intermediate layer are both greater than or equal to $10^{18}$ cm$^{-3}$, and the band gap width of the dielectric layer is greater than or equal to 3 eV, which facilitates realizing of energy level degeneracy at both sides, thus effectively improving the tunneling efficiency of the tunnel junction, increasing the peak tunneling current and reducing the overall series resistance of the device.

The above description is only a summary of the technical scheme of this disclosure, which can be implemented according to the contents of the description in order to understand the technical means of this disclosure more clearly. In order to make the above and other objects, features and advantages of this disclosure more obvious and understandable, the following is a specific embodiment of this disclosure.

BRIEF DESCRIPTION OF THE DRAWINGS

In order to explain implementations of the present disclosure more clearly, the drawings required in the description of the implementations of the present disclosure will be briefly introduced below; obviously, the drawings in the following description are only some implementations of the present disclosure, and other drawings can be obtained according to these drawings by those of ordinary skill in the art without paying creative labor.

Reference numbers are as follows.

1-Upper cell unit, 11-TiO2 Coating, 12-Perovskite Coating, 13-Hole Transport Layer, 14-ITO, 15-p-type Amorphous Silicon Thin Film, 16-Silicon-Germanium Mixed Buffer Layer, 17-Gallium Arsenide Absorption Layer, 18-Gallium Indium Phosphor Window Layer, 19-Antireflection Thin Film, 2-Lower cell unit, 21-n-type Silicon Wafer, 22-n-type Amorphous Silicon, 23-*p*+Layer, 24-Intrinsic Amorphous Silicon, 25-p-type Silicon Wafer, 26-*n*+Layer, 27-PERx, 3-Tunnel junction, 4-Top Electrode, 5-Bottom Electrode, 31-Upper crystalline silicon layer, 311-*n*++Layer, 32-Lower crystalline silicon layer, 321-*p*++Layer, 33-Intermediate layer, 331-SiO$_2$ Dielectric layer, 332-Al$_2$O$_3$ Dielectric layer.

DETAILED DESCRIPTION OF THE EMBODIMENTS

Technical schemes in the implementations of this disclosure will be described clearly and completely with reference to the drawings in the implementations of this disclosure; and it is obvious that the described implementations are part of the implementations of this disclosure, but not all of them. On a basis of the implementations in this disclosure, all other implementations obtained by the ordinary skilled in the art without any creative effort are within the protection scope of this disclosure.

The applicant has found in researches that a main reason of low tunneling efficiency and high overall series resistance of the tunnel junction in the tandem photovoltaic device with the crystalline silicon cell as the lower cell units in the related art are that a slowly changed diffusion interface reduces the effective doping concentration at both sides of an interface of the tunnel junction and broadens a tunneling distance.

Figure 1:
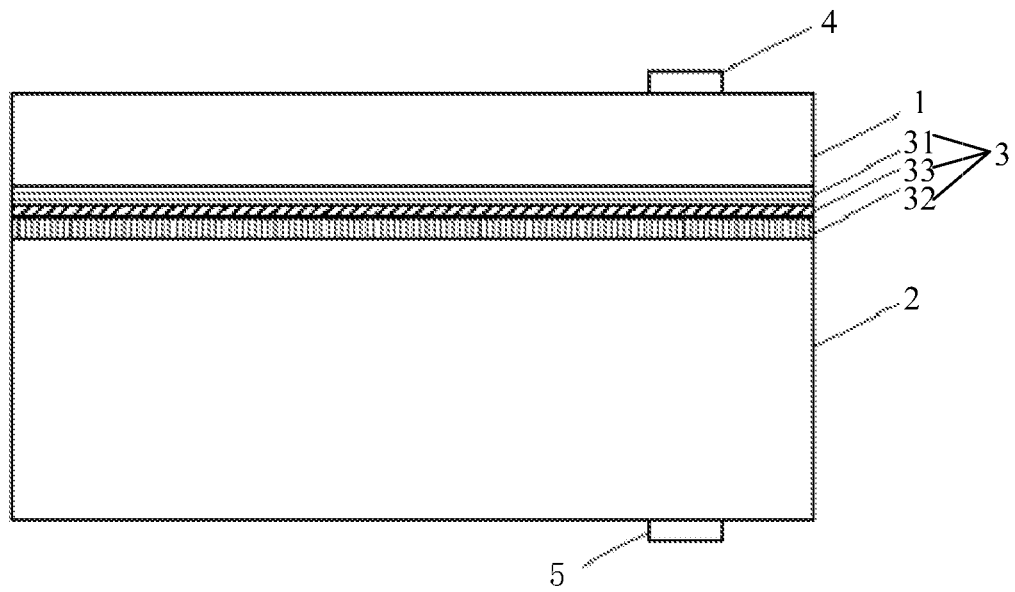
FIG. 1 shows a structural diagram of a first tandem photovoltaic device according to an embodiment of the present disclosure.

In an embodiment of the present disclosure, referring to FIG. 1, which shows a structural diagram of a first kind of tandem photovoltaic device according to an embodiment of the present disclosure. The tandem photovoltaic device includes an upper cell unit 1 and a lower cell unit 2, and a tunnel junction 3 between the upper cell unit 1 and the lower cell unit 2, and the tunnel junction 3 is configured for connecting the upper cell unit 1 and the lower cell unit 2 in series to form the tandem photovoltaic device. It can be understood that the band gaps between the upper cell unit 1 and the lower cell unit 2 are different, and a band gap of the upper cell unit 1 is larger than that of the lower cell unit 2. The lower cell unit is a crystalline silicon cell. Numbers of the tunnel junction, the upper cell unit and the lower cell unit included in the tandem photovoltaic device are not specifically limited in embodiments of the present disclosure. In FIG. 1, a top electrode is indicated by 4 and a bottom electrode is indicated by 5.

It can be understood that the tunnel junction 3 is provided with light transmittance for transmitting remaining light waves after absorption by the upper cell unit. The transmitted light wave with the certain light transmittance may be determined according to the remaining light waves after the absorption by the upper cell unit adjacent to the tunnel junction. For example, the transmitted light may be the remaining light waves after the absorption by the upper cell unit adjacent to the tunnel junction.

Referring to FIG. 1, the tunnel junction 3 includes an upper crystalline silicon layer 31, a lower crystalline silicon layer 32, and an intermediate layer 33 between the upper crystalline silicon layer 31 and the lower crystalline silicon layer 32. The upper crystalline silicon layer 31, the lower crystalline silicon layer 32 and the intermediate layer 33 are in direct contact with each other. The upper crystalline silicon layer 31 is of a first doping type, the lower crystalline silicon layer 32 is of a second doping type, and the first doping type is opposite to the second doping type. For example, if the upper crystalline silicon layer 31 is n-type doped, the lower crystalline silicon layer 32 is p-type doped. The upper crystalline silicon layer 31 is in contact with the upper cell unit 1 and the lower crystalline silicon layer 32 is in contact with the lower cell unit 2. It can be understood that the first doping type of the upper crystalline silicon layer 31 is the same as a doping type of a backlight surface of the upper cell unit 1. The second doping type of the lower crystalline silicon layer 32 is the same as a doping type of a light-facing surface of the lower cell unit 2. For example, if a p-type silicon wafer is used for the lower cell unit 2 and if diffusion to the light surface of the lower cell unit 2 is of n-type, the second doping type of the lower crystalline silicon layer 32 is of n-type.

The intermediate layer includes at least one dielectric layer. A number of dielectric layers is not particularly limited in the embodiment of the present disclosure. By introducing the intermediate layer 33 including the dielectric layer between the upper crystalline silicon layer 31 and the lower crystalline silicon layer 32, mutual diffusion of doping elements in the upper crystalline silicon layer 31 and the lower crystalline silicon layer 32 with opposite doping types can be effectively alleviated under barrier effect of the dielectric layer, so that an abrupt doping interface structure is formed at their interface, and effective doping concentration on both sides can be improved, and thus the tunneling efficiency of the tunnel junction can be effectively improved, the peak tunneling current can be increased, and the overall series resistance of the device can be reduced.

The doping concentration of the upper crystalline silicon layer 31 at the interface with the intermediate layer 33 and the doping concentration of the lower crystalline silicon layer 32 at the interface with the intermediate layer 33 are both greater than or equal to $10^{18}$ cm$^{-3}$. Doping concentration of the rest of the upper crystalline silicon layer 31 can be set according to actual needs. Doping concentration of the rest of the lower crystalline silicon layer 32 also can be set according to actual needs. The band gap width of the dielectric layer is greater than or equal to 3 eV, which is conducive to blocking ineffective tunneling. Doping concentrations at interfaces of both sides of the intermediate layer 33 which in contract with an interface of the upper crystalline silicon layer 31 and an interface of the lower crystalline silicon layer 32 are relatively high, so that the alignment of conduction-band minimum and valence-band maximum is achieved, and facilitates energy level degeneracy at the interface at both sides of the intermediate layer 33, thus effectively improving the tunneling efficiency of the tunnel junction, increasing the peak tunneling current and reducing the overall series resistance of the device.

Optionally, in a tandem direction of the tandem photovoltaic device, the upper crystalline silicon layer 31 is provided with a doping concentration gradient, and/or the lower crystalline silicon layer 32 is provided with a doping concentration gradient. Specifically, in the tandem direction of the tandem photovoltaic device, the doping concentration gradient of the upper crystalline silicon layer 31 can be an increased or decreased type, and the doping concentration gradient of the lower crystalline silicon layer 32 can also be an increased or decreased type to further improve the tunneling efficiency. It should be noted that the doping concentration in the upper crystalline silicon layer 31 at an interface contacting with the intermediate layer 33 is greater than or equal to $10^{18}$ cm$^{-3}$, and the doping concentration in the rest of the upper crystalline silicon layer 31 is set according to actual needs. The doping concentration in the lower crystalline silicon layer 32 at an interface contacting with the intermediate layer 33 is greater than or equal to $10^{18}$ cm$^{-3}$, and the doping concentration in the rest of the lower crystalline silicon layer 32 also can be set according to actual needs. A peak of the doping concentration of the upper crystalline silicon layer 31 may not necessarily be located at its surface, but may be located in an area outside the surface of the upper crystalline silicon layer 31. A peak of the doping concentration of the lower crystalline silicon layer 32 also may not necessarily be located at its surface, but may be located in an area outside the surface of the lower crystalline silicon layer 32.

Optionally, the upper crystalline silicon layer 31 and the lower crystalline silicon layer 32 can be of a single crystal or polycrystalline structure, thus with many types of or more flexible choices.

Optionally, the dielectric strength of the dielectric layer is greater than or equal to 3 MV/cm, which facilitates inhibiting of ineffective tunneling, thus effectively improving the tunneling efficiency, reducing the series resistance of the tunnel junction and increasing the peak tunneling current.

Optionally, the dielectric layer can be made of a material selected from at least one of: silicon oxide, silicon nitride, silicon oxynitride, silicon halide, silicon oxyfluoride, silicon oxycarbide, alkali metal oxide, alkali metal nitride, alkali metal oxynitride, alkali metal halide, alkali metal oxyfluoride, transition metal oxide, transition metal nitride, transition metal oxynitride, transition metal halide, transition metal oxyfluoride, Group III metal oxide, Group III metal nitride, Group III metal oxynitride, Group III metal Metal halides, Group III metal oxyfluorides, Group IV metal nitrides, Group IV metal oxynitrides, Group IV metal halides, or Group IV metal oxyfluorides. The dielectric layer of materials described above has a large band gap width, which facilitates inhibiting of ineffective tunneling, thus effectively improving the tunneling efficiency, reducing the series resistance of the tunnel junction and increasing the peak tunneling current.

Optionally, the dielectric layer can also be made of a material selected from at least one of silicon oxide (for example which can be $SiO_x$, such as $SiO_2$), silicon nitride ($SiN_x$), silicon fluoride (for example, $SiF_4$), silicon oxyfluoride (SiOF), silicon oxycarbide (SiOC), aluminum oxide (for example, $Al_2O_3$), aluminum fluoride ($AlF_x$) and aluminum oxynitride. The dielectric materials described above are with large dielectric strengths and large band gap width, which facilitates inhibiting of ineffective tunneling, thus effectively improving the tunneling efficiency, reducing the series resistance of the tunnel junction and increasing the peak tunneling current.

Optionally, in addition to at least one dielectric layer, the intermediate layer 33 further includes a first transition layer between the dielectric layer and the upper crystalline silicon layer 31 and in direct contact with the upper crystalline silicon layer 31, and/or a second transition layer between the dielectric layer and the lower crystalline silicon layer 32 and in direct contact with the lower crystalline silicon layer 32. The first transition layer between the dielectric layer and the upper crystalline silicon layer 31 and in direct contact with the upper crystalline silicon layer 31 is made of a material selected from at least one product of an interfacial reaction (which is not limited to doping, migration and other means) between the dielectric layer and the upper crystalline silicon layer 31. The second transition layer between the dielectric layer and the lower crystalline silicon layer 32 and in direct contact with the lower crystalline silicon layer 32 is made of a material selected from at least one product of an interfacial reaction between the dielectric layer and the lower crystalline silicon layer 32. The first transition layer and the second transition layer both can function in good chemical passivation of surfaces.

The first transition layer between the dielectric layer and the upper crystalline silicon layer 31 and in direct contact with the upper crystalline silicon layer 31 can be generated by the dielectric layer and the upper crystalline silicon layer 31 through the interfacial reaction (which is not limited to doping, migration and other means), or can be formed independently. The second transition layer between the dielectric layer and the lower crystalline silicon layer 32 and in direct contact with the lower crystalline silicon layer 32 can be generated by the dielectric layer and the lower crystalline silicon layer 32 through the interfacial reaction (which is not limited to doping, migration and other means), or can be formed independently.

Optionally, thicknesses of the upper crystalline silicon layer 31 and the lower crystalline silicon layer 32 are both 2 to 100 nm, and further, the thicknesses of the upper crystalline silicon layer 31 and the lower crystalline silicon layer 32 are both 2 to 10 nm. A thickness of the intermediate layer 33 is 0.1 to 5 nm, and further, the thickness of the intermediate layer 33 may be 0.5 to 1 nm. A thickness of the tunnel junction thus formed is relatively thin, which facilitates reducing of a tunneling distance and improves the tunneling efficiency. Meanwhile, with a thin thickness of the tunnel junction, more optical shielding may not be caused to the lower cell unit.

Optionally, a light-trapping structure is provided on a light-facing surface of the lower cell unit, and the light-facing surface of the lower cell unit is a surface where the lower cell unit is in contact with the lower crystalline silicon layer or a surface in which the lower cell unit is in contact with the tunnel junction. The backlight surface of the tunnel is adapted to a shape of the light-facing surface of the lower cell unit. The backlight surface of the tunnel is a surface in contact with the light-facing surface of the lower cell unit. The light-trapping structure can be an optical nanostructure, a textured structure, etc. The optical nanostructure is a regular light-trapping nanostructure. The textured structure is a pyramid structure, an inverted pyramid structure, or the like. The light-trapping structure is arranged on the light-facing surface of the lower cell unit, and the backlight surface of the tunnel junction is matched with the light-facing surface of the lower cell unit, so that the light-trapping structure is also arranged on the backlight surface of the tunnel junction to increase an optical path. Meanwhile, a structure and material of the tunnel junction are conducive to obtaining the tunnel junction with a uniform thickness and function on the light-trapping structure of the light-facing surface of the lower cell unit.

Figure 2:
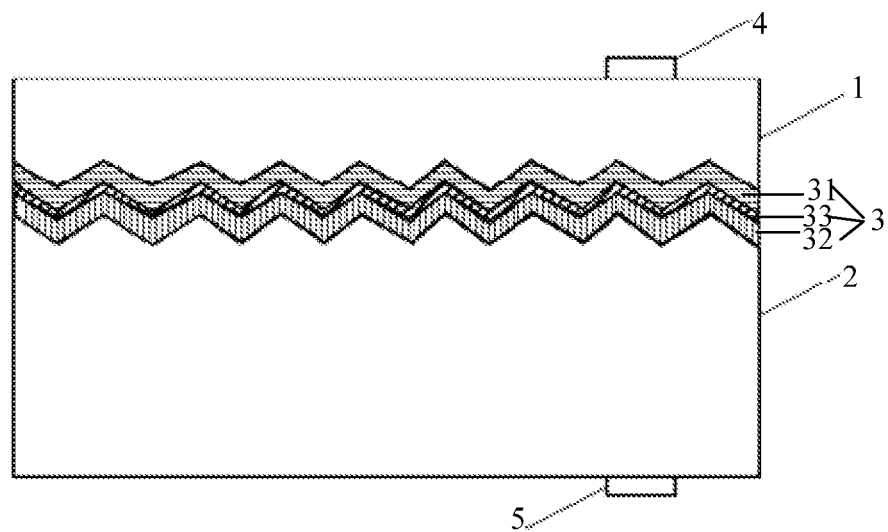
FIG. 2 shows a structural diagram of a second tandem photovoltaic device according to an embodiment of the present disclosure.

For example, referring to FIG. 2, which shows a structural diagram of a second tandem photovoltaic device according to an embodiment of the present disclosure. In this tandem photovoltaic device, the light-facing surface of the lower cell unit 2 is a light-trapping structure, and the backlight surface of the tunnel junction 3 is a light-trapping structure which is adapted to a shape of the light-facing surface of the lower cell unit 2. The light-facing surface of the tunnel junction 3 is a light-trapping structure, and the backlight surface of the upper cell unit 1 is a light-trapping structure adapted to a shape of the light-facing surface of the tunnel junction 3. The light-facing surface of the upper cell unit 1 is a light-trapping structure.

In an embodiment of the present disclosure, the lower cell unit is the crystalline silicon cell, and a doping type of substrate silicon of the lower cell unit is not limited, and it can be with a front p-n junction or a back p-n junction structure, and it can be with a single-side or double-side structure, that is, the bottom electrode can serve as a whole metal back field or can be a local grid line. The light-facing surface of the lower cell unit may be provided with a planar structure or a light-trapping structure. It can be understood that a top of the light-facing surface of the lower cell unit cannot be covered with insulating material or dielectric material, such as a conventional passivation layer or anti-reflection layer, so as to make electrical contact with the tunnel junction. The backlight surface of the lower cell unit can directly cover an electrode. In order to improve photo-electric conversion efficiency of the lower cell unit, any structure can be designed on the backlight surface of the lower cell unit, for example, a passivation layer and an opened electrical lead-out structure (such as Passivated Emitter and Rear Contact (PERC)) can be made; or full or local heavy doping (such as PERT (Passivated Emitter and Rear Totally-Diffused) and PERL (Passivated Emitter and Rear Locally-Diffused) can be further adopted; or an oxide tunneling passivation layer and a polycrystalline transport layer structure (such as TOPCon (Tunnel Oxide Passivated Contact)) can be adopted.

The lower cell unit can be manufactured by using homo-junction or single-sided heterojunction technology, and an area contacted with the lower crystalline silicon layer of the tunnel junction is made of crystal, and front or back p-n junction technology can be adopted. In particular, doping elements of the lower crystalline silicon layer located at the light-facing surface of the lower cell may partially diffuse into the lower cell during a high-temperature process. Because life of a minority carrier of in lower crystalline silicon layer is usually short, a deeper p-n junction depth is preferred when the front p-n junction process is adopted, that is, the p-n junction is provided far from the lower crystalline silicon layer, and duration of the high temperature process is shortened as much as possible to reduce influence of diffusion of the doping elements on the p-n junction.

In the embodiment of the disclosure, a band gap width of the upper cell unit is broader than that of the lower cell unit. A type of the upper cell unit is not specifically limited. For example, a band gap of the upper cell unit may be 1.5 eV to 2.3 eV. For example, the band gap of the upper cell unit may be 1.7 eV to 1.8 eV. For example, the upper cell unit can be a perovskite thin film solar cell, an organic thin film solar cell, a quantum dot thin film solar cell, an amorphous silicon thin film solar cell, an amorphous silicon carbide thin film solar cell, a copper indium gallium selenium thin film solar cell, a cadmium telluride thin film solar cell, a gallium arsenide thin film solar cell, or the like. The upper cell unit may include one or more buffer layers or matching layers needed to contact with the upper crystalline silicon layer in the tunnel junction, so as to reduce resistance or recombination between the tunnel junction and the upper cell unit. The buffer layers or matching layers can function to contact with the crystalline silicon layer in the tunnel junction, collect and transmit carriers from the upper cell unit, and it also has functions of energy band buffering, energy band matching, lattice matching and contact resistance reduction at the same time, so as to further reduce the overall series resistance of the device.

In an embodiment of the present disclosure, electrodes can be provided on a top of the uppermost cell unit and a bottom of the lowermost cell unit. As shown in FIG. 1 or FIG. 2, a top electrode 4 is provided on the top of the uppermost cell unit. A bottom electrode 5 is provided on the bottom of the lowest cell unit. One or more antireflection films may be further provided on the top of the uppermost cell unit. A bottom electrode of the lowest cell unit can serve as an integral metal back field (single-sided cell) or can be a grid line (double-sided cell). The upper and lower cell units need to be electrically and optically adapted.

According to the embodiments of the disclosure, in view of the tandem photovoltaic device with the lower cell unit being the crystalline silicon cell, by introducing the intermediate layer including the dielectric layer between the upper crystalline silicon layer and the lower crystalline silicon layer, mutual diffusion of doping elements in the upper crystalline silicon layer and the lower crystalline silicon layer with opposite doping types can be effectively alleviated under barrier effect of the dielectric layer, so that an abrupt doping interface structure is formed at their interfaces, and effective doping concentration on both sides can be improved, thereby effectively improving the tunneling efficiency, reducing the series resistance of the tunnel junction and improving a peak tunneling current. Meanwhile, the doping concentration of the upper crystalline silicon layer at the interface with the intermediate layer and the doping concentration of the lower crystalline silicon layer at the interface with the intermediate layer are both greater than or equal to $10^{18}$ cm$^{-3}$, and the band gap width of the dielectric layer is greater than or equal to 3 eV, which facilitates realizing of energy level degeneracy at both sides, thus effectively improving the tunneling efficiency, reducing the series resistance of tunnel junctions and increasing the peak tunneling current.

A manufacturing method of a tandem photovoltaic device is further provided in an embodiment of the disclosure. The method comprises following steps S1 to S3.

In step S1, a lower cell unit is prepared. The lower cell unit is a crystalline silicon cell.

In step S2, a tunnel junction is prepared. The tunnel junction includes an upper crystalline silicon layer, a lower crystalline silicon layer and an intermediate layer between the upper crystalline silicon layer and the lower crystalline silicon layer. The upper crystalline silicon layer, the lower crystalline silicon layer and the intermediate layer are in direct contact with each other, and doping types of the upper crystalline silicon layer and the lower crystalline silicon layer are opposite. A doping concentration of the upper crystalline silicon layer at an interface with the intermediate layer and a doping concentration of the lower crystalline silicon layer at an interface with the intermediate layer are both greater than or equal to $10^{18}$ cm$^{-3}$. The intermediate layer includes at least one dielectric layer. A band gap width of the dielectric layer is greater than or equal to 3 eV.

In step S3, an upper cell unit is prepared.

Description of the lower cell unit, the upper cell unit and the tunnel junction in the above steps S1 to S3 can refer to description in the previous embodiment, and the same or similar beneficial effects can be achieved, which, in order to avoid repetition, will not be described repeatedly here.

In the embodiment of the present disclosure, a sequence of steps S1 to S3 is not particularly limited. For example, in a process of preparing the lower cell unit, in view of a fact that some of layers of the lower cell unit cannot bear a high temperature, the layers which cannot bear the high temperature in the lower cell unit can be prepared after the tunnel junction or other parts of the tandem photovoltaic device are prepared.

Optionally, the lower crystalline silicon layer can be prepared with one of following processes: deposition, doping and growing. The deposition process can include depositing a lower crystalline silicon layer of amorphous or nanocrystalline silicon with a corresponding doping concentration on the light-facing surface of the lower cell unit by PVD, CVD or other methods and performing rapid or slow annealing to crystallize. The growth process can include CVD, PVD, ALD and other vapor phase growth methods, or Molecular beam epitaxy (MBE) and other epitaxial growth methods, in which performance of the layer can be further improved by fast or slow annealing after growing. Alternatively, further doping can be made to the light-facing surface of the lower cell unit by thermal diffusion, particle injection, laser doping or other methods.

Optionally, the intermediate layer may be prepared with one of following processes: deposition, water bath, coating, surface in-situ chemical synthesis, wet thermal oxidation, dry thermal oxidation, plasma oxidation, and plasma enhanced or assisted oxidation. Specifically, PVD, CVD, ALD and other deposition processes can be adopted, or chemical processes such as water bath methods and coating methods can be adopted, or surface in-situ chemical synthesis processes such as oxidation and nitridation can be adopted. Particularly, wet thermal oxidation (such as $HNO_3$), $O_3$, $UV/O_3$, dry thermal oxidation, plasma oxidation, PECVD-assisted $N_2O$-oxidized $SiO_x$, CVD or other processes can be used for silicon oxide.

Optionally, the intermediate layer 33 further includes a first transition layer between the dielectric layer and the upper crystalline silicon layer 31 and in direct contact with the upper crystalline silicon layer 31, and/or a second transition layer between the dielectric layer and the lower crystalline silicon layer 32 and in direct contact with the lower crystalline silicon layer 32. The first transition layer between the dielectric layer and the upper crystalline silicon layer 31 and in direct contact with the upper crystalline silicon layer 31 can be formed by the interfacial reaction between the dielectric layer and the lower crystalline silicon layer 31, or can be formed independently. The second transition layer between the dielectric layer and the lower crystalline silicon layer 32 and in direct contact with the lower crystalline silicon layer 32 can be formed by the interfacial reaction between the dielectric layer and the lower crystalline silicon layer 32, or can be formed independently.

For example, 0.5 nm silicon oxide is deposited using an ALD method, then 1 nm aluminum oxide and then 0.5 nm silicon oxide is deposited. The aluminum oxide can serve as the dielectric layer, and the silicon oxide at both sides can serve as the first transition layer and the second transition layer which are independently formed.

Optionally, the crystalline silicon layer can be prepared with one of following processes: deposition and growing. Specifically, the deposition process includes depositing an amorphous or nanocrystalline silicon film with a corresponding doping concentration by PVD, CVD and other methods and performing rapid or slow annealing. The growing process includes CVD, PVD, ALD and other vapor phase growth methods, or MBE and other epitaxial growth methods, in which performance of the layer can be further improved by fast or slow annealing after growth.

Several tandem photovoltaic devices and their manufacturing processes are illustrated in the following.

Figure 3:
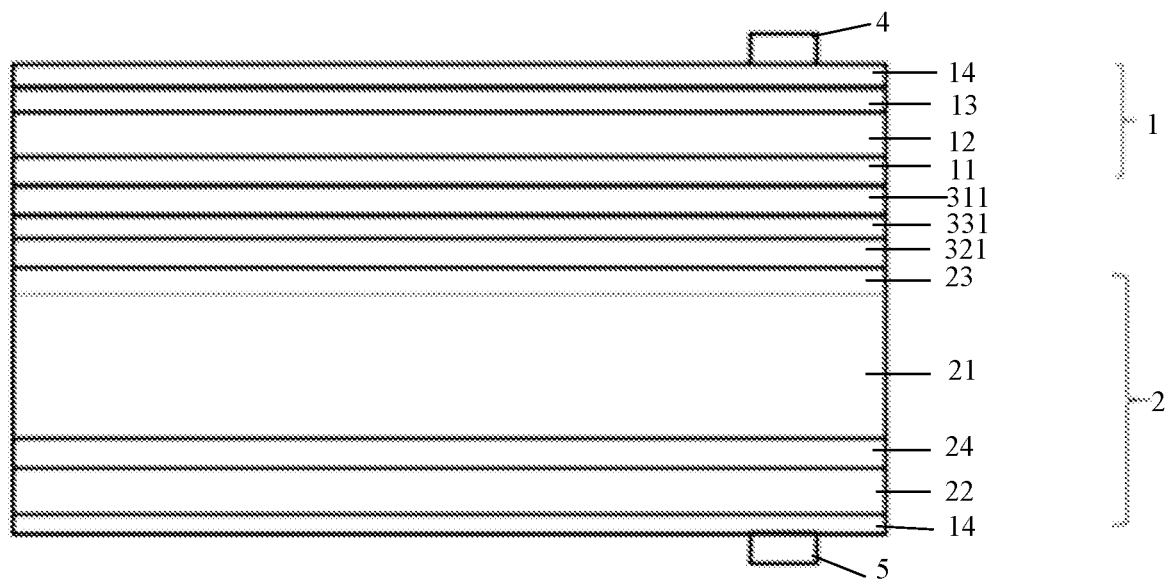
FIG. 3 shows a structural diagram of a third tandem photovoltaic device according to an embodiment of the present disclosure.

Referring to FIG. 3, which shows a structural diagram of a third tandem photovoltaic device according to an embodiment of the present disclosure. In the tandem photovoltaic device shown in FIG. 3, the lower cell unit 2 is made of an n-type silicon wafer 21, the backlight surface of the lower cell unit 2 is passivated using intrinsic amorphous silicon and n-type amorphous silicon 22 is deposited for electronic transmission. Because temperature tolerance of the amorphous silicon is poor, the amorphous silicon can be deposited after the tunnel junction or other parts of the tandem photovoltaic device are prepared. The light-facing surface of the lower cell unit 2 may be provided with a pyramid textured structure. Perovskite with a wide band gap is adopted in the upper cell unit 1 as an absorption layer, and a band gap width of the absorption layer is 1.6 to 1.8 eV. The absorption layer is provided with a morphology that conforms to the light-facing surface of the lower cell unit 2. The intermediate layer shown in FIG. 3 includes a dielectric layer, namely a $SiO_2$ dielectric layer 331.

The manufacturing process of the tandem photovoltaic device shown in FIG. 3 is as follows.

Firstly, a silicon wafer is cleaned and its upper and lower surfaces are textured. A p-type layer is made on a light-facing surface by diffusion or by deposition followed by crystallization to form a p-n junction, and the lower crystalline silicon layer is prepared on the light-facing surface of the p-type layer by diffusion or by deposition followed by crystallization. The lower crystalline silicon layer 32 is heavily p++ doped with a doping concentration of $10^{18}$ $cm^{-3}$. The p-type layer and a p++ layer 321 of the lower crystalline silicon layer can be made by one-step diffusion or by crystallization followed by deposition, and a p+transition layer 23 is formed between them. A thickness of the p++ layer 321 of the lower crystalline silicon layer is 5 nm, which is calculated from a position where the doping concentration reaches $10^{20}$ $cm^{-3}$.

The $SiO_2$ dielectric layer 331 with a thickness of 1 nm is manufactured on the light-facing surface of the p++ layer 321 of the lower crystalline silicon layer, which can be made by surface oxidation (thermal oxidation, chemical oxidation), ALD deposition or other methods.

The $SiO_2$ dielectric layer, that is, the upper crystalline silicon layer 31, is heavily n++ doped, which can be made by amorphous silicon over-deposition followed by crystallization, or CVD, PVD or other growing methods. A doping concentration of the upper crystalline silicon layer 31 is $10^{20}$ $cm^{-3}$ and a thickness of the upper crystalline silicon layer is 5 nm.

The $TiO_2$ coating 11 is deposited on a light-facing surface of an n++ layer 311 of the upper crystalline silicon layer, which can be made by chemical methods or vacuum deposition methods.

High-temperature processes are allowed for the above layers, from cleaning of the silicon wafer to complete fabrication of the $TiO_2$ coating 11.

Intrinsic amorphous silicon 24 and n-type amorphous silicon 22 are deposited on a backlight surface of the above structure. A perovskite coating 12 and a hole transport layer 13 are deposited on a light-facing side of the above structure. ITO 14 is deposited on both sides of the above structure and electrodes are deposited to complete a whole structure.

Figure 4:
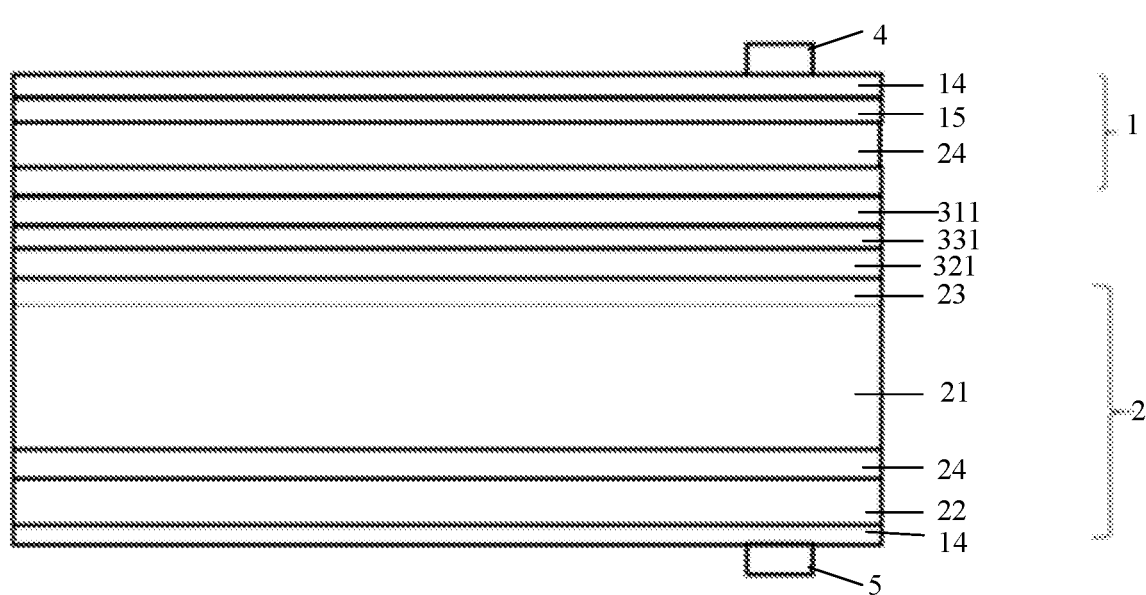
FIG. 4 shows a structural diagram of a fourth tandem photovoltaic device according to an embodiment of the present disclosure.

Referring to FIG. 4, which shows a fourth tandem photovoltaic device according to an embodiment of the present disclosure. In the tandem photovoltaic device shown in FIG. 4, the lower cell unit 2 is made of an n-type silicon wafer 21, the backlight surface of the lower cell unit 2 is passivated using intrinsic amorphous silicon and n-type amorphous silicon 22 is deposited for electronic transmission. Because the temperature tolerance of the amorphous silicon is poor, the amorphous silicon can be deposited after the tunnel junction or other parts of the tandem photovoltaic device are prepared. The light-facing surface of the lower cell unit 2 may have a pyramid textured structure. Amorphous silicon with a wide band gap is adopted in the upper cell unit 1 as an absorption layer, and a band gap width of the absorption layer is 1.7 eV. The absorption layer is provided with a morphology that conforms to the light-facing surface of the lower cell unit 2. The intermediate layer shown in FIG. 4 includes a dielectric layer, namely a $SiO_2$ dielectric layer 331.

The manufacturing process of the tandem photovoltaic device shown in FIG. 4 is as follows.

Firstly, a silicon wafer is cleaned and its upper and lower surfaces are textured. A p-type layer is made on a light-facing surface by diffusion or by deposition followed by crystallization to form a p-n junction, and the lower crystalline silicon layer is prepared on the light-facing surface of the p-type layer by diffusion or by deposition followed by crystallization. The lower crystalline silicon layer 32 is a heavily p++ doped layer with a doping concentration of $10^{20}$ $cm^{-3}$. The p-type layer and a p++ layer 321 of the lower crystalline silicon layer can be made by one-step diffusion or by crystallization followed by deposition, and a p+transition layer 23 is formed between them. A thickness of the p++ layer 321 of the lower crystalline silicon layer is 5 nm, which is calculated from a position where the doping concentration reaches $10^{20}$ $cm^{-3}$.

The $SiO_2$ dielectric layer 331 with a thickness of 1 nm is manufactured on the light-facing surface of the p++ layer 321 of the lower crystalline silicon layer, which can be made by surface oxidation (thermal oxidation, chemical oxidation), ALD deposition or other methods.

A light-facing surface of the $SiO_2$ dielectric layer 331, that is, the upper crystalline silicon layer 31, is heavily n++ doped, which can be made by amorphous silicon over-deposition followed by crystallization, or CVD, PVD or other growing methods. A doping concentration of this layer is $10^{20}$ $cm^{-3}$ and a thickness of this layer is 5 nm.

An intrinsic amorphous silicon film is deposited on both sides of the above structure. An n-type amorphous silicon thin film 22 is deposited on a backlight surface of the above structure. A p-type amorphous silicon thin film 15 is deposited on a light-facing surface of the above structure. ITO14 and metal electrodes were deposited on both sides of the above structure to complete the device.

Figure 5:
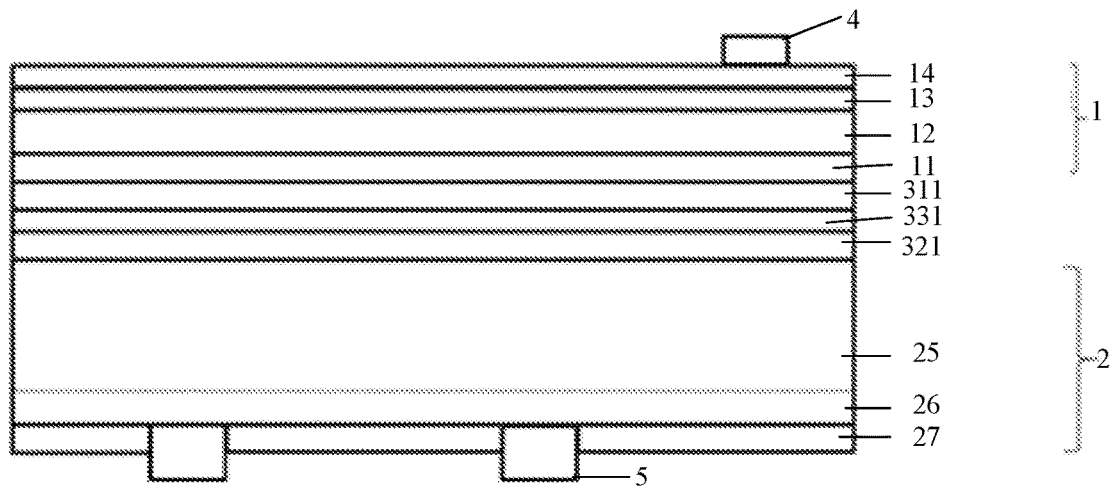
FIG. 5 shows a structural diagram of a fifth tandem photovoltaic device according to an embodiment of the present disclosure.

Referring to FIG. 5, which shows a structural diagram of a fifth tandem photovoltaic device according to an embodiment of the present disclosure. In the tandem photovoltaic device shown in FIG. 5, the lower cell unit 2 is made of a p-type silicon wafer 25, and the backlight surface of the lower cell unit 2 is made by PERx (PERC, PERT, PERL) passivation technologies, the tandem photovoltaic device is textured on both sides and can receive light on both sides. Perovskite with a wide band gap is adopted in the upper cell unit 1 as an absorption layer, and a band gap width of the absorption layer is 1.6 to 1.8 eV. The absorption layer is provided with a morphology that conforms to the light-facing surface of the lower cell unit 2. The intermediate layer shown in FIG. 5 includes a dielectric layer, namely a $SiO_2$ dielectric layer 331.

The manufacturing process of the tandem photovoltaic device shown in FIG. 5 is as follows.

Firstly, the silicon wafer is cleaned and its upper and lower surfaces are textured. An n-type layer is made on a backlight surface by diffusion or by deposition followed by crystallization to form a p-n junction, and an n+ layer 26 is made on a light surface of an n-type layer by diffusion or by deposition followed by crystallization to form a back field. A PERx structure 27 is made on a back of the above structure for back passivation. The lower crystalline silicon layer 32 is formed by diffusion or by deposition followed by crystallization on its backlight surface. The lower crystalline silicon layer is a p++ layer 321 with a doping concentration of $10^{19}$ $cm^{-3}$. A thickness of the p++ layer 321 of the lower crystalline silicon layer is 8 nm, which is calculated from a position where the doping concentration reaches an order of $10^{19}$ $cm^{-3}$.

The $SiO_2$ dielectric layer 331 with a thickness of 0.8 nm is manufactured on the light-facing surface of the p++ layer 321 of the lower crystalline silicon layer, which can be made by surface oxidation (thermal oxidation, chemical oxidation), ALD deposition or other methods.

The $SiO_2$ dielectric layer 331, that is, the upper crystalline silicon layer 31, is heavily n++ doped, which can be made by amorphous silicon over-deposition followed by crystallization, or CVD, PVD or other growing methods. A doping concentration of this layer is $10^{19}$ $cm^{-3}$ and a thickness of this layer is 5 nm, which is calculated from a position where the doping concentration reaches an order of $10^{19}$ $cm^{-3}$.

The $TiO_2$ coating 11 is deposited on a light-facing surface of an n++ layer 311 of the upper crystalline silicon layer, which can be made by chemical methods or vacuum deposition methods.

A perovskite coating 12 and a hole transport layer 13 are deposited on a light-facing side of the above structure. ITO 14 is deposited on both sides of the above structure and electrodes are deposited to complete a whole structure.

Figure 6:
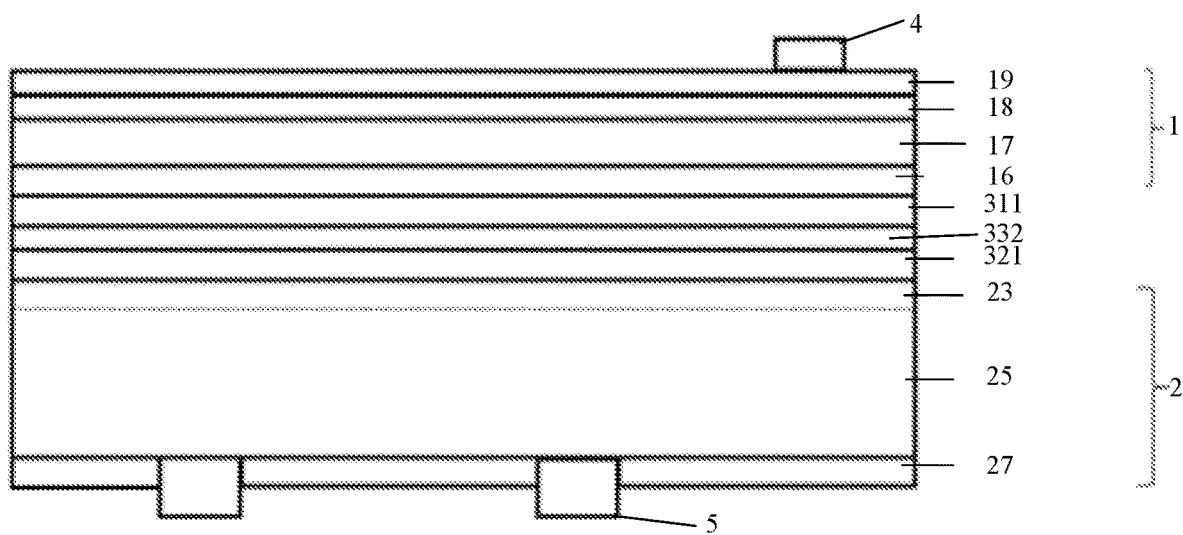
FIG. 6 shows a structural diagram of a sixth tandem photovoltaic device according to an embodiment of the present disclosure.

Referring to FIG. 6, which shows a structural diagram of a sixth tandem photovoltaic device according to an embodiment of the present disclosure. In the tandem photovoltaic device shown in FIG. 6, the lower cell unit 2 is made of a p-type silicon wafer 25, and the backlight surface of the lower cell unit 2 is made by PERx (PERC, PERT, PERL) passivation technologies, the tandem photovoltaic device is textured on both sides and can receive light on both sides. The light-facing surface of the lower cell unit 2 may be a pyramid textured surface. Gallium arsenide with a wide band gap is adopted in the upper cell unit 1 as an absorption layer, and a band gap width of the absorption layer is 1.6 to 1.8 eV. The absorption layer is provided with a morphology that conforms to the light-facing surface of the lower cell unit 2. The intermediate layer shown in FIG. 6 includes a dielectric layer, namely an $Al_2O_3$ dielectric layer 332.

The manufacturing process of the tandem photovoltaic device shown in FIG. 6 is as follows.

Firstly, a silicon wafer is cleaned and its upper and lower surfaces are textured. A p-type layer is made on a light-facing surface by diffusion or by deposition followed by crystallization to form a p-n junction, and the lower crystalline silicon layer is prepared on an upper surface of the p-type layer by diffusion or by deposition followed by crystallization. The lower crystalline silicon layer 32 is a heavily p++ doped layer 321 with a doping concentration of $10^{20}$ $cm^{-3}$, and a thickness of a p++ layer 321 of the lower crystalline silicon layer is 5 nm, which is calculated from a position where the doping concentration reaches an order of $10^{20}$ $cm^{-3}$. The p-type layer and a p++ layer 321 of the lower crystalline silicon layer can be made by one-step diffusion or by crystallization followed by deposition, and a p+transition layer 23 is formed between them. A PERx passivation structure 27 is manufactured on its back side.

The $Al_2O_3$ dielectric layer 332 with a thickness of 0.8 nm is manufactured on the light-facing surface of the p++ layer 321 of the lower crystalline silicon layer, which can be made by surface oxidation (thermal oxidation, chemical oxidation), ALD deposition or other methods.

The $Al_2O_3$ dielectric layer 332, that is, the upper crystalline silicon layer 31, is heavily n++ doped, which can be made by amorphous silicon over-deposition followed by crystallization, or CVD, PVD or other growing methods. A doping concentration of this layer is $10^{20}$ $cm^{-3}$ and a thickness of this layer is 5 nm, which is calculated from a position where the doping concentration reaches an order of $10^{20}$ $cm^{-3}$.

A silicon-germanium mixed buffer layer 16 can be made on a light-facing surface of an n++ layer 311 of the upper crystalline silicon layer by CVD or epitaxial processes. A GaAs absorption layer 17 is grown on the buffer layer, and a thickness of the absorption layer is about 1.5 μm. A window layer 18 of phosphor gallium indium is grown on the absorption layer. An antireflection film 19 is deposited on the window layer.

Electrodes are deposited or printed on both sides of front and back surfaces of the above structure to complete the structure.

In the embodiments of the present disclosure, respective steps of the method can refer to relevant records in the previous embodiment, and the same or similar beneficial effects can be achieved, which, in order to avoid repetition, will not be described repeatedly here.

It should be noted that, for sake of simple description, the method implementations are all expressed as combination of a series of action, but it should be known by those skilled in the art should that the implementations of the present disclosure are not limited by a sequence of the described actions, because some of the steps can be performed in other sequences or simultaneously according to the implementations of the present disclosure. Secondly, it also should be known by those skilled in the art that the implementations described in the specification are all preferred implementations, and the actions involved are not necessarily necessary for the implementations of the present disclosure.

In the implementations of the disclosure, the tandem photovoltaic device and the manufacturing method for the same, respective devices and the like can be referred to each other.

The implementations of the present disclosure have been described with reference to the drawings, but the present disclosure is not limited to the specific embodiments described above, which are merely illustrative rather than restrictive. Many forms can be made by those skilled in the art without departing from spirit of the present disclosure and the scope of the claims upon inspiration of the present disclosure, all of which are within the scope of the present disclosure.

The invention claimed is:

1. A tandem photovoltaic device, comprising an upper cell unit, a lower cell unit and a tunnel junction between the upper cell unit and the lower cell unit, wherein the lower cell unit is a crystalline silicon cell;
the tunnel junction comprises an upper crystalline silicon layer, a lower crystalline silicon layer and an intermediate layer between the upper crystalline silicon layer and the lower crystalline silicon layer;
the upper crystalline silicon layer, the lower crystalline silicon layer and the intermediate layer are in direct contact with each other, and doping types of the upper crystalline silicon layer and the lower crystalline silicon layer are opposite, a doping concentration of the upper crystalline silicon layer at an interface with the intermediate layer, and a doping concentration of the lower crystalline silicon layer at an interface with the intermediate layer are both greater than or equal to $10^{18}$ cm$^{-3}$; and
the intermediate layer comprises at least one dielectric layer, and a band gap width of the dielectric layer being greater than or equal to 3 eV;
wherein a light-facing surface of the lower cell unit is provided with a light-trapping structure, and a backlight surface of the tunnel junction is adapted to a shape of the light-facing surface of the lower cell unit.

2. The tandem photovoltaic device according to claim 1, wherein dielectric strength of the dielectric layer is greater than or equal to 3 MV/cm.

3. The tandem photovoltaic device according to claim 1, wherein the dielectric layer is made of a material selected from at least one of: silicon oxide, silicon nitride, silicon oxynitride, silicon halide, silicon oxyfluoride, silicon oxycarbide, alkali metal oxide, alkali metal nitride, alkali metal oxynitride, alkali metal halide, alkali metal oxyfluoride, transition metal oxide, transition metal nitride, transition metal oxynitride, transition metal halide, transition metal oxyfluoride, Group III metal oxide, Group III metal nitride, Group III metal oxynitride, Group III metal Metal halides, Group III metal oxyfluorides, Group IV metal nitrides, Group IV metal oxynitrides, Group IV metal halides, or Group IV metal oxyfluorides.

4. The tandem photovoltaic device according to claim 3, wherein the dielectric layer is made of a material selected from at least one of: silicon oxide, silicon nitride, silicon fluoride, silicon oxyfluoride, silicon oxycarbide, aluminum oxide, aluminum fluoride or aluminum oxynitride.

5. The tandem photovoltaic device according to claim 1, wherein thicknesses of the upper crystalline silicon layer and the lower crystalline silicon layer are both 2 to 100 nm; and a thickness of the intermediate layer is 0.1 to 5 nm.

6. The tandem photovoltaic device according to claim 1, wherein the intermediate layer further comprises a first transition layer between the dielectric layer and the upper crystalline silicon layer and in direct contact with the upper crystalline silicon layer, and/or a second transition layer between the dielectric layer and the lower crystalline silicon layer and in direct contact with the lower crystalline silicon layer; wherein
the first transition layer is made of a material selected from at least one product of an interfacial reaction between the dielectric layer and the upper crystalline silicon layer; and
the second transition layer is made of a material selected from at least one product of an interfacial reaction between the dielectric layer and the lower crystalline silicon layer.

7. The tandem photovoltaic device according to claim 1, wherein in a tandem direction of the tandem photovoltaic device, the upper crystalline silicon layer is provided with a doping concentration gradient, and/or the lower crystalline silicon layer is provided with a doping concentration gradient.

8. A manufacturing method for a tandem photovoltaic device, comprising:
preparing a lower cell unit, the lower cell unit being a crystalline silicon cell;
preparing a tunnel junction, wherein the tunnel junction comprises an upper crystalline silicon layer, a lower crystalline silicon layer and an intermediate layer between the upper crystalline silicon layer and the lower crystalline silicon layer; the upper crystalline silicon layer, the lower crystalline silicon layer and the intermediate layer are in direct contact with each other, and doping types of the upper crystalline silicon layer and the lower crystalline silicon layer are opposite; a doping concentration of the upper crystalline silicon layer at an interface with the intermediate layer and a doping concentration of the lower crystalline silicon layer at an interface with the intermediate layer are both greater than or equal to $10^{18}$ cm$^{-3}$; and
the intermediate layer includes at least one dielectric layer, a band gap width of the dielectric layer being greater than or equal to 3 eV;
wherein a light-facing surface of the lower cell unit is provided with a light-trapping structure, and a backlight surface of the tunnel junction is adapted to a shape of the light-facing surface of the lower cell unit; and
preparing an upper cell unit.

9. The method according to claim 8, wherein the lower crystalline silicon layer is prepared with one of following processes:
deposition, doping and growing;
the intermediate layer is prepared with one of following processes:
deposition, water bath, coating, surface in-situ chemical synthesis, wet thermal oxidation, dry thermal oxidation, plasma oxidation, and plasma enhanced or assisted oxidation; and
the upper crystalline silicon layer is prepared with one of following processes:
deposition and growing.

10. The method according to claim 8, wherein the intermediate layer further comprises at least one of: a first transition layer between the dielectric layer and the upper crystalline silicon layer and in direct contact with the upper crystalline silicon layer; and a second transition layer between the dielectric layer and the lower crystalline silicon layer and in direct contact with the lower crystalline silicon layer; and preparing the tunnel junction comprises at least one of:

forming a first transition layer between the dielectric layer and the upper crystalline silicon layer, the first transition layer being made of a material selected from at least one product of an interfacial reaction between the dielectric layer and the upper crystalline silicon layer; and forming the second transition layer between the dielectric layer and the lower crystalline silicon layer, the second transition layer being made of a material selected from at least one product of an interfacial reaction between the dielectric layer and the lower crystalline silicon layer.

* * * * *